(12) United States Patent
Roessler et al.

(10) Patent No.: US 12,374,640 B2
(45) Date of Patent: *Jul. 29, 2025

(54) DEVICE FOR CONTROLLING TRAPPED IONS

(71) Applicant: Infineon Technologies Austria AG, Villach (AT)

(72) Inventors: Clemens Roessler, Villach (AT); Silke Auchter, Villach (AT); Martin Gruber, Schwandorf (DE); Johanna Elisabeth Roessler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 18/594,703

(22) Filed: Mar. 4, 2024

(65) Prior Publication Data

US 2024/0213193 A1    Jun. 27, 2024

Related U.S. Application Data

(63) Continuation of application No. 17/488,388, filed on Sep. 29, 2021, now Pat. No. 11,984,416.

(30) Foreign Application Priority Data

Sep. 30, 2020    (EP) .................................... 20199325

(51) Int. Cl.
*H01L 23/00*    (2006.01)

(52) U.S. Cl.
CPC .............. *H01L 24/05* (2013.01); *H01L 24/03* (2013.01); *H01L 2224/0212* (2013.01); *H01L 2224/0239* (2013.01); *H01L 2224/03552* (2013.01)

(58) Field of Classification Search
CPC .............. H01L 24/05; H01L 2224/0212; H01J 49/4225
See application file for complete search history.

(56) References Cited

U.S. PATENT DOCUMENTS 11,031,303 B1 * 6/2021 Shih ................ H01L 21/823864
11,056,332 B1 * 7/2021 Maunz ................ H01J 49/0018
(Continued)

FOREIGN PATENT DOCUMENTS

CN    104540869 A  *  4/2015  ............. C08G 59/56
CN    106024575 A  *  10/2016
(Continued)

*Primary Examiner* — Mamadou L Diallo
(74) *Attorney, Agent, or Firm* — Murphy, Bilak & Homiller, PLLC

(57) ABSTRACT

A device for trapping ions includes: a substrate having a metal layer structure; and at least one ion trap configured to trap ions in a space over the substrate. The metal layer structure is a multi-layer metal structure that includes: a top metal layer having one or more electrodes forming part of the at least one ion trap; a redistribution metal layer having wiring for connecting the one or more electrodes; a first insulating layer arranged between the top metal layer and the redistribution layer and having one or more voids; and one or more connection elements arranged in the one or more voids that connect the wiring from the redistribution metal layer with the one or more electrodes in the top metal layer.

20 Claims, 6 Drawing Sheets

(56) References Cited

U.S. PATENT DOCUMENTS

| | | | | |
|---|---|---|---|---|
| 11,764,051 B2* | 9/2023 | Rellergert | ........... | H01J 49/4225 |
| | | | | 250/283 |
| 2004/0157364 A1* | 8/2004 | Combi | ............... | H01H 59/0009 |
| | | | | 438/106 |
| 2007/0040113 A1* | 2/2007 | Monroe | ................ | H01J 49/422 |
| | | | | 250/288 |
| 2019/0043822 A1* | 2/2019 | Falcon | .................... | H01L 24/29 |
| 2019/0066993 A1 | 2/2019 | Ramsey et al. | | |
| 2022/0367164 A1* | 11/2022 | Blain | .................... | G06N 10/40 |

FOREIGN PATENT DOCUMENTS

| | | | | | |
|---|---|---|---|---|---|
| DE | 102018111220 B3 * | 5/2019 | | ............... | H01J 3/00 |
| EP | 1203397 A1 | 5/2002 | | | |
| EP | 2372745 A2 | 10/2011 | | | |
| EP | 2779207 A2 * | 9/2014 | | .......... | H01J 49/0018 |
| GB | 2479190 A * | 10/2011 | | .......... | H01J 49/0013 |
| GB | 2479191 A * | 10/2011 | | .......... | H01J 49/0018 |
| WO | 0108197 A1 | 2/2001 | | | |

\* cited by examiner

DEVICE FOR CONTROLLING TRAPPED IONS

TECHNICAL FIELD

This disclosure relates generally to the field of trapped ions, and in particular to devices for controlling trapped ions for quantum computing and methods of manufacturing such devices.

BACKGROUND

Trapped ions are one of the most promising candidates for use as qubits (quantum bits) in quantum computers since they can be trapped with long lifetimes in a scalable array by virtue of electromagnetic fields. Presently, the most advanced ion traps can control about 50 qubits individually and can maintain up to 16 qubits in a fully entangled state. Future quantum computers will need to increase the number of controllable qubits to more than 100 or even 1000 to outperform classical supercomputers. Further, the number of ions used for each qubit will in future be raised to about 6 to 100 ions in order to allow for more efficient error-correction during quantum computing.

With increasing the number of ions, the area requirement for devices for controlling trapped ions such as, e.g., quantum computing devices increases. Assuming a mean distance between neighboring ions of 10 to 100 μm and a number of 10000 ions, the total required area may be as large as 100 $cm^2$ to 1 $m^2$. Hence, increasing the number of simultaneously trapped ions while maintaining the ability to control and measure them individually is one of the main challenges in controlling trapped ions and, in particular, in progressing to practical quantum computing.

Problems which arise when scaling-up the number of ions and/or industrial application are to provide for mechanical stability of the device and for low complexity of electrical connecting and junctions. Further, scalability in terms stability, electrical connecting and junctions and optical properties is desired.

SUMMARY

According to an aspect of the disclosure, a device for controlling trapped ions includes a first semiconductor substrate. A second semiconductor substrate is disposed over the first semiconductor substrate. At least one ion trap is configured to trap ions in a space between the first semiconductor substrate and the second semiconductor substrate. A spacer is disposed between the first semiconductor substrate and the second semiconductor substrate, the spacer comprising an electrical interconnect which electrically connects a first metal layer structure of the first semiconductor substrate to a second metal layer structure of the second semiconductor substrate.

According to another aspect of the disclosure, a method of manufacturing a device for controlling trapped ions comprises providing a first semiconductor substrate having a first metal layer structure. The method further comprises providing a second semiconductor substrate having a second metal layer structure. The first semiconductor substrate and the second semiconductor substrate are connected by mounting a spacer between the first semiconductor substrate and the second semiconductor substrate. The first metal layer structure is thereby connected to the second metal layer structure via an electrical interconnect which is provided by the spacer to form one or a plurality of ion traps configured to trap ions in a space between the first semiconductor substrate and the second semiconductor substrate.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

The words "over" or "beneath" with regard to a part, element or material layer formed or located or disposed or arranged or placed "over" or "beneath" a surface may be used herein to mean that the part, element or material layer be located (e.g. placed, formed, arranged, disposed, placed, etc.) "directly on" or "directly under", e.g. in direct contact with, the implied surface. The word "over" or "beneath" used with regard to a part, element or material layer formed or located or disposed or arranged or placed "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
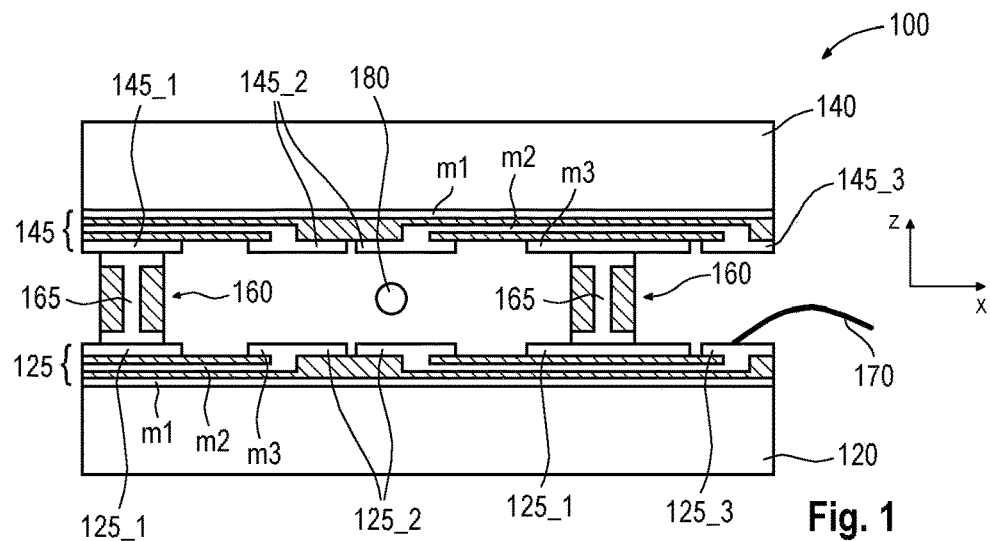
FIG. 1 is a schematic cross-sectional view of an exemplary device for controlling trapped ions.

Referring to FIG. 1 a device 100 for controlling trapped ions may include a first semiconductor substrate 120 and a second semiconductor substrate 140. The second semiconductor substrate 140 is disposed over the first semiconductor substrate 120 in Z-direction. The Z-direction may represent the height dimension of the device 100.

The second semiconductor substrate 140 is spaced apart in Z-direction from the first semiconductor substrate 120 so as to define a space between the first semiconductor substrate 120 and the second semiconductor substrate 140.

The first and the second semiconductor substrates 120, 140 may be substantially planar (except for surface structures created e.g. by electrodes, oxide or passivation) and may be oriented parallel to each other. In FIG. 1, parallelism of the first and second semiconductor substrates 120, 140 is exemplarily depicted in the X-direction and may, e.g., also apply to the Y-direction. The X-direction and Y-direction are perpendicular to each other and define a plane in the length and width direction of the device 100, which is normal to the Z-direction.

The first and second semiconductor substrates 120, 140 may both be micro-structured semiconductor substrates, e.g. micro-structured semiconductor chips or wafers. Semiconductor materials which are in particular suitable are Si, SiC and GaN or similar materials. In a broader definition, the term semiconductor material may also comprise fused silica, quartz glass, or sapphire. For instance and without loss of generality, the first and second semiconductor substrates 120, 140 are, e.g., silicon chips.

The distance between the first semiconductor substrate 120 and the second semiconductor substrate 140 may be in a range between, e.g., 50 µm to 1000 µm, in particular 100 µm to 400 µm, or 200 µm to 300 µm. The first semiconductor substrate 120 and the second semiconductor substrate 140 may, e.g., have each a thickness in a range between, e.g., 250 µm to 1500 µm, in particular 300 µm to 1000 µm, more in particular 400 µm to 750 µm or 500 µm to 600 µm.

As will be described further below in more detail, the space (defined between the first semiconductor substrate 120 and the second semiconductor substrate 140) includes one or a plurality of ion traps configured to trap one or a plurality of ions 180 in the space (only one ion 180 is illustrated in FIG. 1 for ease of illustration). The location of the ions 180 can be controlled by the one or more ion traps, e.g. the ions 180 can be moved in the space in one or more lateral directions (e.g. in the X-direction or in any direction lying in a plane which is normal to the Z-direction).

The first semiconductor substrate 120 is provided with a first metal layer structure 125 implemented at a top side of the first semiconductor substrate 120. The second semiconductor substrate 140 is provided with a second metal layer structure 145 implemented at a bottom side of the second semiconductor substrate 140.

A spacer 160 is disposed between the first semiconductor substrate 120 and the second semiconductor substrate 140. The spacer 160 comprises an electrical interconnect 165 which electrically connects the first metal layer structure 125 of the first semiconductor substrate 120 to a second metal layer structure 145 of the second semiconductor substrate 140. To this end, the spacer 160 may either be the electrical interconnect by itself (see e.g. FIG. 13B, where the spacer 160 is a metal spacer) or may be formed from an insulating material which is equipped with the electrical interconnect 165.

As shown in FIG. 1, the spacer 160 may comprise or be a printed circuit board (PCB). The PCB is provided with vias forming the electrical interconnect 165.

Generally, the PCB for use as a spacer may be zero-layer PCB or a single-layer PCB or multi-layer PCB. A multi-layer PCB has a top metallization layer, a bottom metallization layer and an electrical interconnect for electrically interconnecting the top metallization layer (or structures thereof) and the bottom metallization layer (or structures thereof). In one example, such electrical interconnect may be implemented simply by vias. In this case, the PCB may be a two-layer PCB. In another example, the electrical interconnect may further comprise an electrical redistribution function. In this case, the PCB may be a 3-or-more layer PCB with one or more intermediate metallization layer(s) acting as an electrical redistribution structure. As known in the art, metallization layers of a PCB may be structured as conductive tracks, pads and other features etched from one or more layers of metal (e.g. copper) laminated onto and/or between non-conductive sheet layers of the PCB.

In one example, the sheet layer(s) of the PCB may comprise or be of a polymer or a resin, e.g. epoxy. The polymer or resin may be reinforced by fibres and/or fillers of, e.g., glass or other reinforcing structures. E.g. a FR4 type PCB may be used. In another example, the sheet layer(s) of the PCB may comprise or be of a ceramic material. In this example, the PCB is a so-called ceramic PCB, e.g. a high-temperature co-fired ceramic (HTCC) PCB, a low-temperature co-fired ceramic (LTCC) PCB or a thick film ceramic PCB. In still another example, the PCB may be a so-called metal core PCB wherein the sheet layer(s) of the PCB may comprise a metal layer.

More specifically, the first metal layer structure 125 may comprise first contact pads 125_1 and first electrodes 125_2. The second metal layer structure 145 may comprise second contact pads 145_1 and second electrodes 145_2. The first electrodes 125_2 and the second electrodes 145_2 may form part of at least one ion trap. The electrical interconnect 165 (e.g. vias) of the spacer 160 (e.g. PCB) may electrically connect the first contact pads 125_1 to the second contact pads 145_1 and/or to the second electrodes 145_2 of the second metal layer structure 145.

The spacer 160 may define the distance between the first and second semiconductor substrates 120, 140. As will described further below in greater detail, the spacer 160 may comprise a number of spacer members and may, e.g., be provided with one or more optical ports to allow laser light to be introduced and/or focused in the space between the substrates 120, 140.

The first metal layer structure 125 and/or the second metal layer structure 145 may each be multi-layer metal structures. For instance, first metal layer structure 125 and/or the second metal layer structure 145 may each include three metal layers. The lowest metal layer, so-called metal 1 (m1), may be configured to screen the respective semiconductor substrate 120, 140 optically and electrically. Metal 1 (m1) may be a continuous metal layer. Metal 2 (m2), the metal layer above metal 1, may be a redistribution layer, i.e. may be a structured metal layer which is used for wiring, e.g. for wiring the first contact pads 125_1 and first electrodes 125_2 and/or the second contact pads 145_1 and the second electrodes 145_2. Metal 2 (m2) may be electrically insulated from metal 1 by an insulating layer arranged between metal 1 and metal 2. Metal 3 (m3), the top metal layer, may define the electrode arrangement for the one or plurality of ion traps and, e.g., the contact pad arrangement for the interconnect 165. In the example of FIG. 1, metal 3 (m3) forms the first contact pads 125_1 and first electrodes 125_2 and the second contact pads 145_1 and the second electrodes 145_2. Hence, metal 3 (m3) is typically a structured metal layer comprising RF electrodes and, optionally, DC electrodes and contact pads. Metal 3 (m3) is electrically connected to metal 2 (m2) by vias which connect through an electrically insulating layer arranged between metal 2 (m2) and metal 3 (m3). Three metal layers m1, m2, m3 are used on each semiconductor substrate 120, 140 in the example shown. More or less metal layers may be used if needed.

The metal layers m1, m2, m3 may be manufactured during front-end-of-line (FEOL) semiconductor processing. E.g. metals such as Cu, Al, Au, Pt, Pd, Ti, TiW etc. may be used. The surface of metal 3 (m3) may be plated by a chemically inert and electrically conductive material such as, e.g. Au or Pt to avoid surface charge generation. The insulating layers between the metal layers m1, m2, m3 may, e.g., comprise or be of silicon nitride and/or silicon oxide.

The first semiconductor substrate 120 may be provided with external terminals of the device 100. The external terminals may be used to electrically connect the device 100 to external circuitry, e.g. to external circuitry provided on an application board on which the device 100 is to be mounted. In addition or alternatively, external terminals of the device 100 may be implemented at the second semiconductor substrate 140.

More specifically, referring to the exemplary device 100 of FIG. 1, the first metal layer structure 125 comprises first external terminals 125_3. Optionally, the second metal layer structure 145 can comprise external terminals 145_3, if additional electric connection is required. The first and the optional second external terminals 125_3, 145_3 may be formed in metal 3 (m3).

The first external terminals 125_3 may electrically connect to the first electrodes 125_2 and/or to the first contact pads 125_1. If the first external terminals 125_3 are electrically connected (e.g. via m2) to the first contact pads 125_1 (not shown in FIG. 1), they may connect via the electrical interconnect 165 to the second metal layer structure 145 of the second semiconductor substrate 140. Analogously, the second external terminals 145_3 may electrically connect to the second electrodes 145_2 and/or to the second contact pads 145_1. If the second external terminals 145_3 are electrically connected (e.g. via m2) to the second contact pads 145_1 (not shown in FIG. 1), they may connect via the electrical interconnect 165 to the first metal layer structure 125 of the first semiconductor substrate 120.

Figure 2:
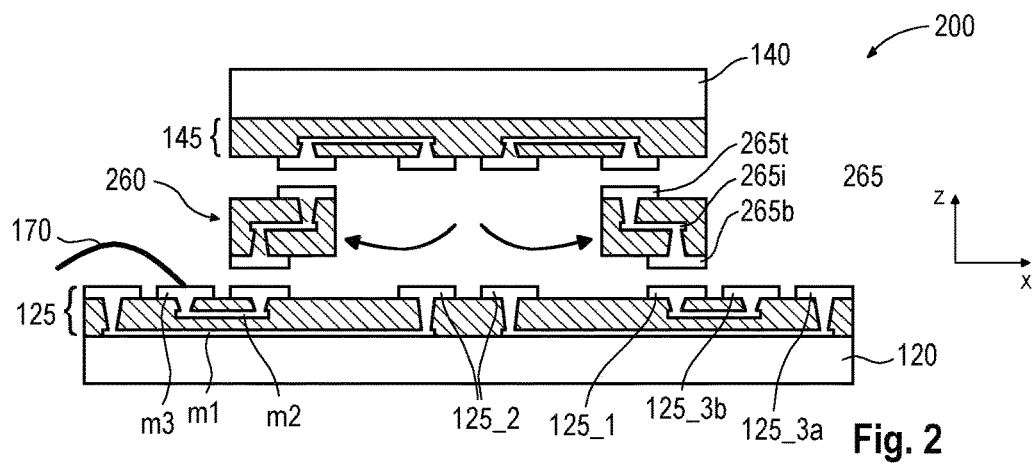
FIG. 2 is a schematic cross-sectional exploded view of a further exemplary device for controlling trapped ions.

Referring to FIG. 2, an exemplary device 200 for controlling trapped ions may comprise a spacer 260 which may be the same as spacer 160 except that in the case that the spacer 260 comprises or is a PCB, the spacer 260 may comprise an electrical interconnect 265 having a top metallization layer 265t, an intermediate metallization layer 265i and a bottom metallization layer 265b. The intermediate metallization layer 265i is structured as an electrical redistribution layer, i.e. adds routing flexibility to the electrical interconnect 265 of spacer 260. This alleviates the challenge of interconnect complexity which is in particular encountered for devices 100, 200 controlling a large number of ions and/or if external terminals for one semiconductor substrate 120, 140 are arranged on the other semiconductor substrate 140, 120.

Further, device 200 illustrates an example for which the first semiconductor substrate is provided with external terminals 125_3a for the first metal layer structure 125 and with external terminals 125_3b for the second metal layer structure 145. The external terminals 125_3a may electrically connect to the first electrodes 125_2 and the external terminals 125_3b may electrically connect via the electrical interconnect 265 to the second electrodes 145_2.

In one example, the first semiconductor substrate 120 or the second semiconductor substrate 140 may be provided with all external terminals of the device 100, 200 (see e.g. FIG. 2, in which external terminals 125_3a, 125_3b for both semiconductor substrates 120, 140 are provided on the first semiconductor substrate 120 while optionally the second semiconductor substrate 140 is not provided with any external terminal). Bonding of connecting wires is only necessary to one surface which makes electrical contacts easier, machine accessible and more reliable.

Apart from these differences, the device 200 may be designed in accordance with the device 100, and reference is made to the above description in order to avoid reiteration.

The one or more ion traps implemented in the space between the first semiconductor substrates 120 and the second semiconductor substrate 140 may have an RF Paul trap design. Paul traps may have an electrode layout including DC electrodes and RF electrodes that leads to RF trapping in all three dimensions (known as point traps) or may have an electrode layout including DC electrodes and RF electrodes which causes two-dimensional RF trapping plus static electric-field trapping in the third dimension (known as linear ion traps). In a point ion trap there is only one point, termed RF null, where the RF field is zero, while a linear ion trap has, in general, a zero RF field existing along a line, which is termed RF null line. Other types of ion traps such as, e.g., Penning traps or Kingdon traps or Orbit traps are also feasible. As will be explained in more detail further below, different ion manipulation zones may be implemented in the space between the first semiconductor substrates 120 and the second semiconductor substrate 140.

Figure 3:
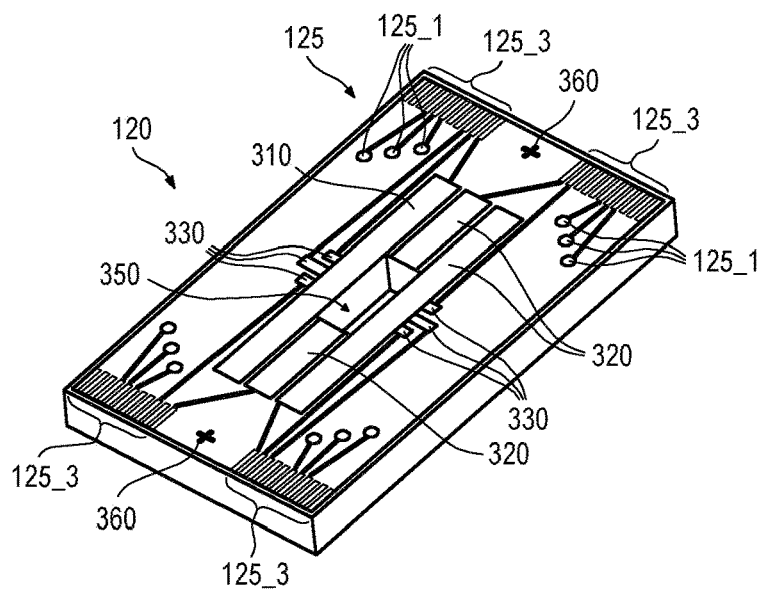
FIG. 3 is a perspective view on a top side of a first semiconductor substrate provided with a first metal layer structure.

FIG. 3 is a perspective view on the top side of the first semiconductor substrate 120. FIG. 3 exemplifies a possible layout of the first metal layer structure 125. It is to be noted that a variety of different layouts is feasible and therefore any feature of the layout of FIG. 3 could also be implemented in other layouts which are different from the particular layout of the first metal layer structure 125 of FIG. 3.

The first semiconductor structure 120 may have a rectangular shape. For instance, the first semiconductor structure 120 may have a length L in a range between, e.g., 2 and 100 mm, in particular 2 and 20 mm, and a width W in a range between 2 and 100 mm, in particular 2 and 20 mm. In the exemplary case of the single ion trap as shown and described with respect to the figures, L=8 mm and W=4 mm. However, these dimensions are variable and could, e.g., be scaled-up to be equal to or greater than a factor of two or three or four or ten etc. of the aforementioned figures either to modify the size of a single ion trap and/or to implement a plurality of ion traps.

As apparent from FIG. 3, the first external terminals 125_3 may, e.g., be located adjacent to edge regions of the first semiconductor structure 120.

The first metal layer structure 125 may further be provided with an RF stripe electrode 310 and multiple DC stripe electrodes 320. The RF stripe electrode 310 and the DC stripe electrodes 320 are arranged around a central opening 350 in the first semiconductor structure 120. Further, the first metal layer structure 125 may be provided with DC pad electrodes 330 which are arranged at both sides of the opening 350. The RF stripe electrode 310, the DC stripe electrodes 320 and the DC pad electrodes 330 are to be understood as a specific layout example for the first electrodes 125_2 of FIGS. 1 and 2 and may form part of one or more ion traps. Other layouts with multiple RF stripe electrodes and/or multiple openings are also possible.

As apparent from FIG. 3, all electrodes 310, 320, 330 are connected to respective external terminals 125_3 of the first metal layer structure 125 on the first semiconductor substrate 120. Further, some of the first electrodes 125_2 are connected to first contact pads 125_2 of the first metal layer structure 125. Reference numeral 360 indicates alignment marks which may be provided on the first semiconductor substrate 120.

Figure 4:
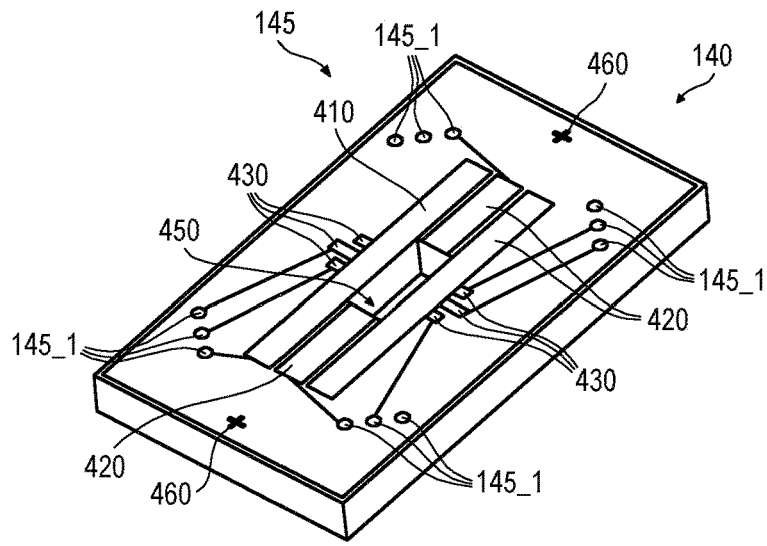
FIG. 4 is a perspective view on a bottom side of a second semiconductor substrate provided with a second metal layer structure.

FIG. 4 illustrates an exemplary layout of the second metal layer structure 145 provided on the second semiconductor substrate 140. The second metal layer structure 145 comprises an electrode arrangement which is similar to the electrode arrangement of the first metal layer structure 125. More specifically, the electrode arrangement comprises an RF stripe electrode 410, DC stripe electrodes 420 and DC pad electrodes 430. An opening 450 in the second semiconductor structure 140 may be situated in a center region of the electrode arrangement. Further, second contact pads 145_1 of the second metal layer structure 145 are electrically connected with respective RF and/or DC electrodes 310, 320, 330 of the second metal layer structure 145. Alignment marks 460 similar to alignment marks 360 of FIG. 3 may be provided on the second semiconductor substrate 140.

The second metal layer structure 145 may be void of any external terminals (similar to the device 200 illustrated in FIG. 2, which is not provided with second external terminals 145_3).

Figure 5:
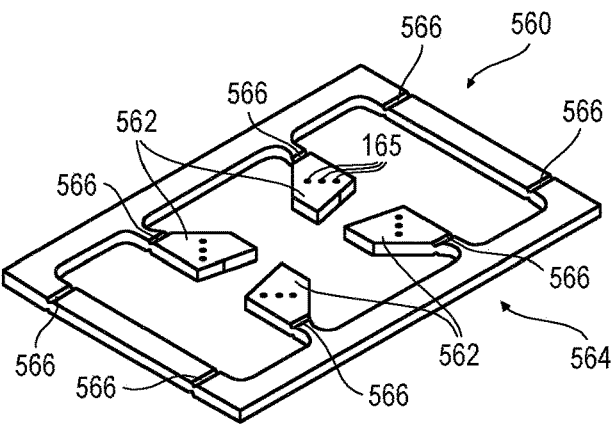
FIG. 5 is a perspective view on a top side of a spacer including a number of spacer members and a spacer frame.

FIG. 5 illustrates an exemplary spacer 560. The spacer 560 may comprise a number of spacer members 562. The spacer members 562 are functional spacers to be arranged between the semiconductor substrates 120, 140 and keeping the distance between them. Hence, the spacer members 562 correspond to the spacers 160, 260 as described above. In one example the spacer members 562 are attached to a spacer frame 564. That is, the spacer frame 564 mechanically connects the spacer members 562 at least for mounting. The spacer frame 564 and the spacer members 562 may form a single part. A break line 566 such as, e.g., a notch may be provided between each spacer member 562 and the spacer frame 564. Further, as shown in FIG. 5, break lines 566 may be provided at outer portions of the spacer frame 564. The spacer members 562 may, e.g., have a wedge-like and/or approximately trapezoidal shape.

The spacer members 562 are provided with the electrical interconnect 165. In the example shown in FIG. 5, the electrical interconnect 165 is provided by three (or any other number of) vias. In view of the electrical interconnect 165, the spacer 560 may, e.g., be designed in accordance with spacer 160 or in accordance with spacer 260. As mentioned before, the spacer 560 may, e.g., be formed by a structured PCB.

Figure 6:
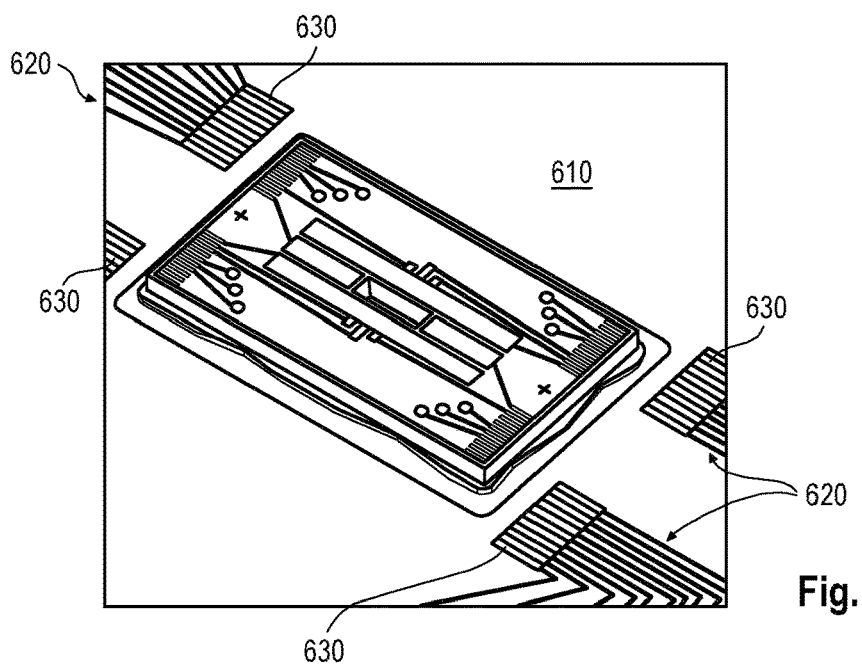
FIG. 6 is a perspective view on the first semiconductor substrate after being mounting on an application board.

FIG. 6 illustrates the first semiconductor substrate 120 after being mounted on an application board 610. The first semiconductor substrate 120 may, e.g., be glued or otherwise fixed to the application board 610. The application board 610 may be provided with leads 620 connected to lead terminals 630. The leads 620 and lead terminals 630 form part of an application board circuitry configured to electrically connect the first semiconductor substrate 120 (or, more generally, the devices 100, 200) for operation.

Figure 7:
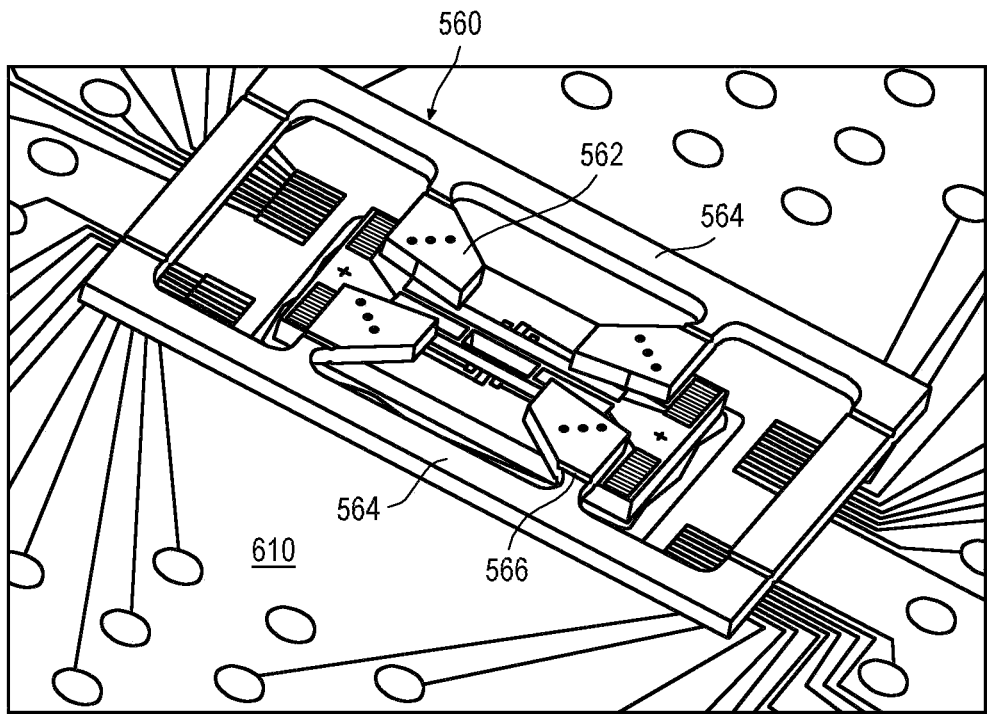
FIG. 7 is a perspective view on the first semiconductor substrate of FIG. 6 after mounting a spacer on the first semiconductor substrate.

Referring to FIG. 7, the spacer 560 may then be placed above the first semiconductor substrate 120. The electrical interconnect 165 of the spacer 560 is aligned with the first contact pads 125_1 of the first metal layer structure 125. Before placing the spacer 560 on the first semiconductor structure 120, solder or adhesive glue or a sinter material may be placed on the first metal layer structure 125 and/or on the electrical interconnect 165 for connecting the first semiconductor substrate 120 to the spacer 560. Spacer frame 564 may be used for handling, placing and positioning of the spacer members 562.

Figure 8:
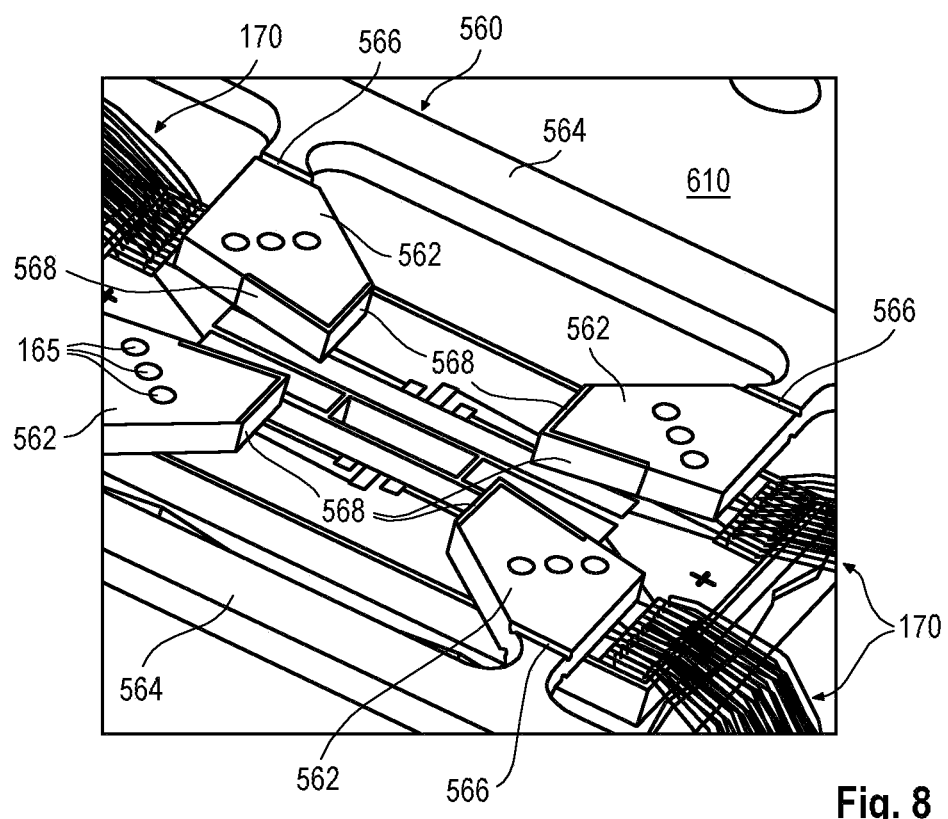
FIG. 8 is an enlarged perspective view on the first semiconductor substrate of FIG. 7 after wire bonding the first semiconductor substrate to the application board.

Referring to FIG. 8, the first electrical terminals 125_3 of the first metal layer structure 125 may then be electrically connected to the lead terminals 630 on the application board 610. FIG. 8 further illustrates that the spacer 560 or, more specifically, the spacer members 562 of the spacer 560 may have metallized side walls 568 facing a central region of the first semiconductor substrate 120. The metallized side walls 568 may adjoin the electrode arrangement of the first metal layer structure 125 so that ions kept in an ion trap formed by the electrode arrangement are facing the metallized side walls 568 in later directions. The metallization may, e.g., be of gold or platinum or palladium. These metals provide for a high work function of electrons released from these metals (e.g. by laser irradiation).

Figure 9:
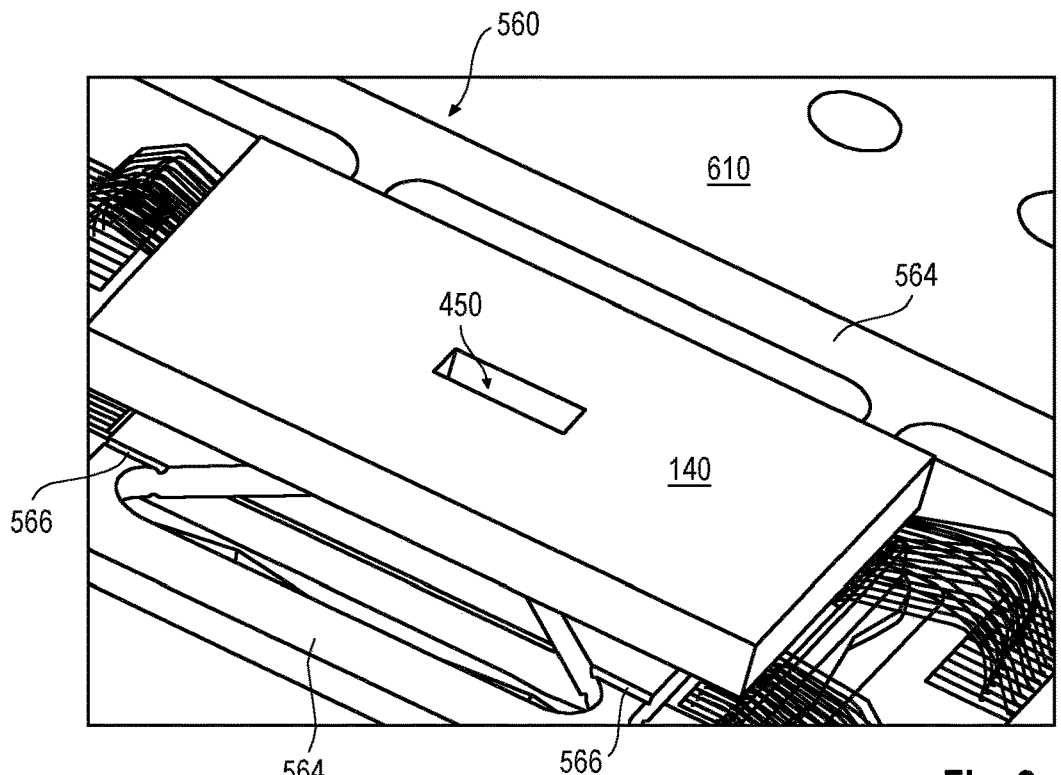
FIG. 9 is a perspective view on the arrangement shown in FIG. 8 after mounting a second semiconductor substrate on the spacer.

FIG. 9 illustrates the arrangement of FIG. 8 after mounting a second semiconductor substrate 140 on the spacer 560. The first metal layer structure 125 and the second metal layer structure 145 are arranged to face each other. Before placing the second semiconductor structure 140 on the spacer 560, solder or adhesive glue or a sinter material may be placed on the electrical interconnect 165 and/or on the second metal layer structure 145 electrical interconnect 165 for connecting the second semiconductor substrate 140 to the spacer 560. The alignment marks 360, 460 could be used to align the second semiconductor structure 140, the spacer 560 and the first semiconductor structure 120. More specifically, the first contact pads 125_1, the electrical interconnect 165 and the second contact pads 145_1 are in alignment with each other.

Figure 10:
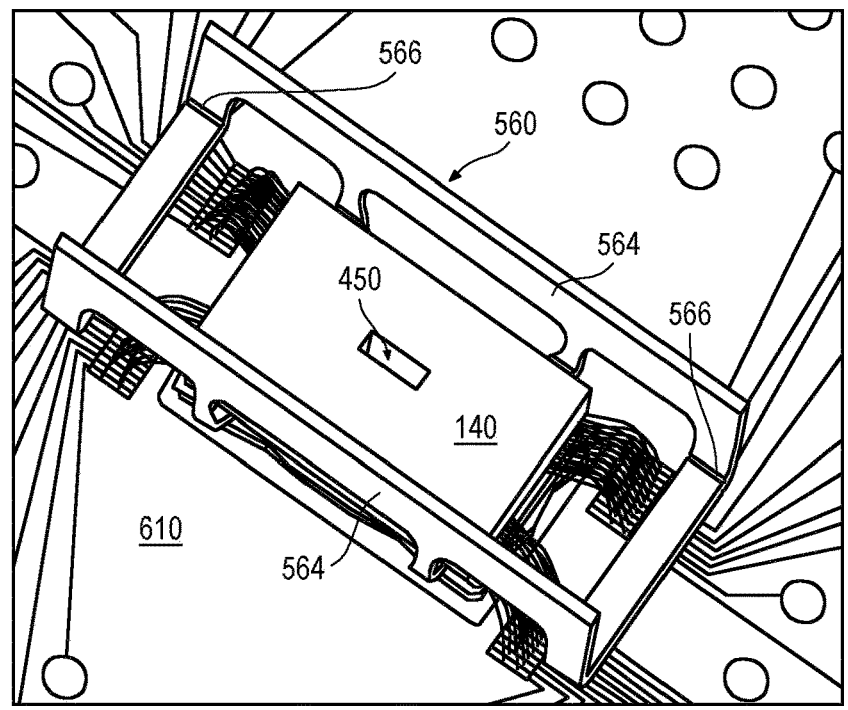
FIG. 10 is a perspective view on the arrangement shown in FIG. 9 after bending frame parts of the spacer away from spacer members of the spacer.

FIG. 10 illustrates the optional removal of the spacer frame 564 from the spacer members 562 of the spacer 560. For instance, frame parts of the spacer 560 are bent up and removed from the spacer 560 at the break lines 566. After the spacer frame 564 is removed, lateral access to the ion trap is provided, for example for laser light.

Figure 11:
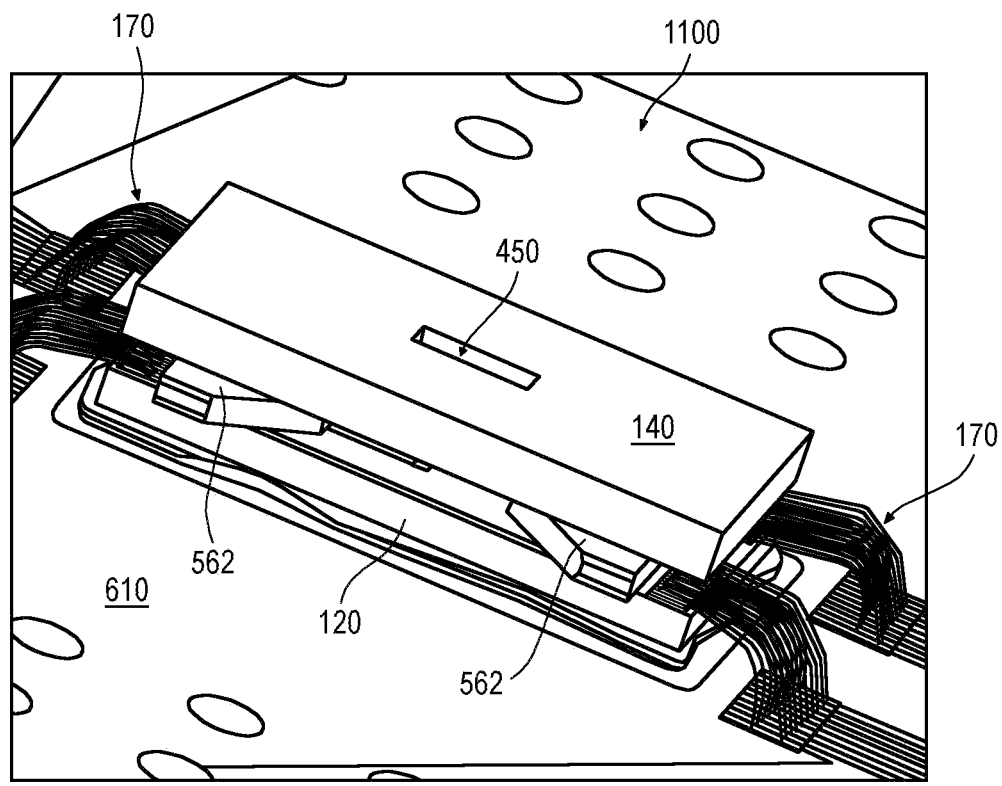
FIG. 11 is a perspective view on an exemplary device manufactured from the arrangement shown in FIG. 10 by removing the frame parts of the spacer from the spacer members.

Referring to FIG. 11, a device 1100 for controlling trapped ions as, e.g., manufactured in accordance with the stages of manufacturing illustrated in FIGS. 6 to 10 is shown. It is to be noted that the order of manufacturing processes exemplified by these Figures can be changed. The device 1100 is similar to devices 100 and 200, and reference is made to the above description in order to avoid reiteration.

The devices 100, 200, 1100 for controlling trapped ions may implement a number of different functionalities in terms of ion loading, handling and control.

For instance, ions can be trapped in a processing zone in which quantum operations between trapped ions (then acting as so-called quantum bits (qubits)) may be carried out. If the ions are trapped as qubits, the qubit states need to be read out. Hence, a processing zone typically requires the access of laser light for laser-based state preparation of trapped ions and laser light for reading out the qubit states (or alternatively the read-out operation may be carried out in a separate read-out zone). Further, laser light may be needed for ion cooling and fluorescence light from ions needs to be collected for state measurement. Further, trapped ions in a processing zone of a quantum computing device need to be protected from scattered light and interfering electrical fields. Therefore, a high degree of optical accessibility and a high degree of interference screening is desirable for a processing zone.

FIG. 11 illustrates by way of example that the devices 100, 200, 1100 allow laser light to be introduced to the center region of the device 100, 200, 1100 in lateral directions (e.g. at multiple or all sides of the device 100, 200, 1100 through the free spaces between the spacer members 562) and in vertical direction (Z-direction) through one or more of the openings 350, 450. Further, one or more of the openings 350, 450 may be used for loading neutral atoms into the device 100, 200, 1100, which may then be ionized (by use of another laser) to provide for the trapped ions.

Figure 12:
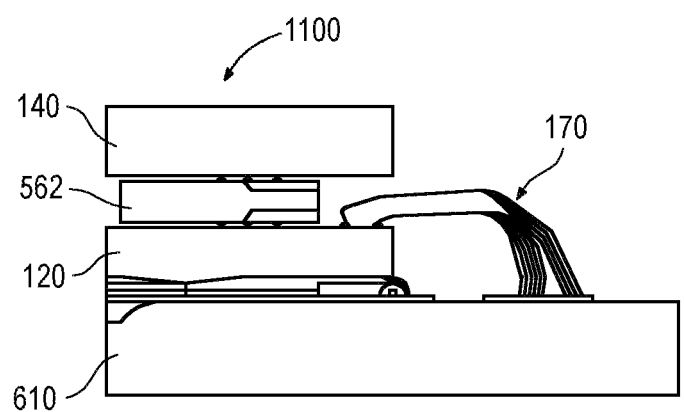
FIG. 12 is a partial side view of the exemplary device of FIG. 11.

A partial side view of the exemplary device 1100 is shown in FIG. 12. As mentioned above, the complexity of electrical connection (e.g. by wire bonds 170) between the device 1100 and external circuitry on the application board 610 may be significantly lowered by the spacer 560 which, moreover, can provide for high mechanical stability of the device 1100.

In another example, the spacer may be a metal spacer 1360. Referring to FIG. 13B, a metal spacer 1360 may be formed by a structured metal plate. The metal spacer 1360 may have the same shape as the spacer 160, 260 (e.g. PCB spacer) described above. Each of the spacer members 1362 (corresponding to spacer members 562) forms by itself a (single) electrical interconnect. Break lines 1366 similar to break lines 566 may be provided between each spacer member 1362 and the spacer frame 1364.

Figure 13A:
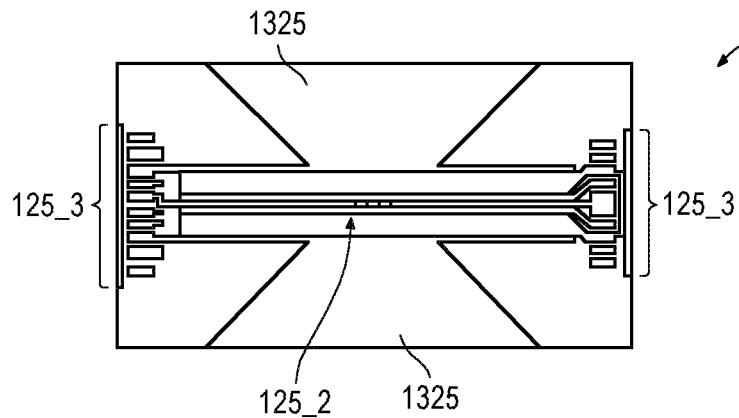
FIGS. 13A-13C are top views of a first semiconductor substrate, a metal spacer and a second semiconductor substrate according to another example of the disclosure.
Figure 13B:
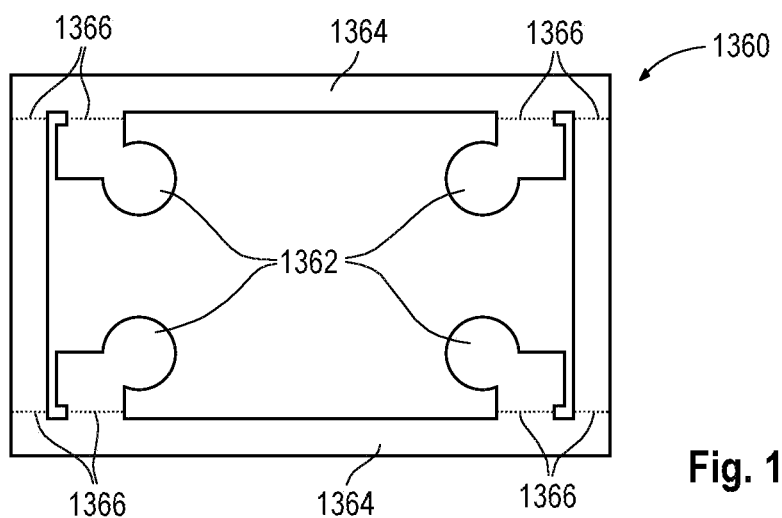
Figure 13C:
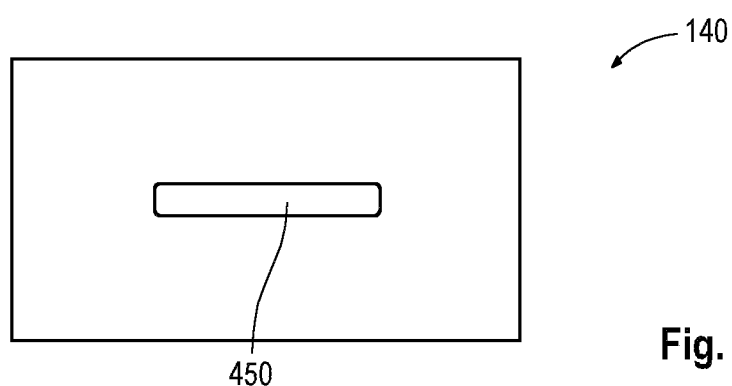

FIGS. 13A and 13C illustrate a first semiconductor substrate 120 and a second semiconductor substrate 140, respectively, which may be used for chip stacking in accordance with all embodiments described herein. As apparent from FIG. 13A, e.g. the second semiconductor substrate 140 has a recessed outline which allows improved optical and electrical access to the device 100, 200, 1100. As apparent from FIG. 13C, the first semiconductor substrate 120 (and/or the second semiconductor substrate 140 at its bottom side) may, e.g., have metallized areas 1325 covering the surface of the first semiconductor substrate 120 in regions where laser light is introduced into the device 100, 200, 1100. The metallized areas 1325 may, e.g., be structured in metal 3 (m3), see FIGS. 1 and 2.

The following examples pertain to further aspects of the disclosure:

Example 1 is a device for controlling trapped ions. The device includes a first semiconductor substrate. A second semiconductor substrate is disposed over the first semiconductor substrate. At least one ion trap is configured to trap ions in a space between the first semiconductor substrate and the second semiconductor substrate. A spacer is disposed between the first semiconductor substrate and the second semiconductor substrate, the spacer comprising an electrical interconnect which electrically connects a first metal layer structure of the first semiconductor substrate to a second metal layer structure of the second semiconductor substrate.

In Example 2, the subject matter of Example 1 can optionally include wherein the first metal layer structure comprises first contact pads and first electrodes, the first electrodes forming part of the at least one ion trap; and the electrical interconnect electrically connects first contact pads to second contact pads of the second metal layer structure and/or second electrodes of the second metal layer structure, the second electrodes forming part of the at least one ion trap.

In Example 3, the subject matter of Example 1 or 2 can optionally include wherein the spacer comprises a printed circuit board.

In Example 4, the subject matter of Example 3 can optionally include wherein the printed circuit board is provided with vias forming the electrical interconnect.

In Example 5, the subject matter of Example 3 or 4 can optionally include wherein the printed circuit board comprises a top metallization layer, an intermediate metallization layer and a bottom metallization layer, wherein the intermediate metallization layer is structured as an electrical redistribution layer.

In Example 6, the subject matter of Example 4 or 5 can optionally include wherein the printed circuit board has metallized side walls facing the space between the first semiconductor substrate and the second semiconductor substrate.

In Example 7, the subject matter of Example 1 or 2 can optionally include wherein the spacer is a metal spacer.

In Example 8, the subject matter of any preceding Example can optionally include wherein the spacer comprises a number of spacer members, the spacer members are disposed at corners of the first semiconductor substrate and the second semiconductor substrate.

In Example 9, the subject matter of any preceding Example can optionally include wherein the spacer has a thickness in a range between 100 µm and 400 µm or 200 µm and 300 µm.

In Example 10, the subject matter of any preceding Example can optionally include wherein the first semiconductor substrate and/or the second semiconductor substrate is a silicon chip.

In Example 11, the subject matter of any preceding Example can optionally include wherein the first semiconductor substrate is provided with external terminals of the device, the external terminals are electrically connected via the electrical interconnect to the second metal layer structure of the second semiconductor substrate.

In Example 12, the subject matter of any preceding Example can optionally include wherein the first semiconductor substrate and/or the second semiconductor substrate are provided with an opening for optical access to the space between the first semiconductor substrate and the second semiconductor substrate Example 13 is a method of manufacturing a device for controlling trapped ions. The method comprises providing a first semiconductor substrate having a first metal layer structure. The method further comprises providing a second semiconductor substrate having a second metal layer structure. The first semiconductor substrate and the second semiconductor substrate are connected by mounting a spacer between the first semiconductor substrate and the second semiconductor substrate. The first metal layer structure is thereby connected to the second metal layer structure via an electrical interconnect which is provided by the spacer to form one or a plurality of ion traps configured to trap ions in a space between the first semiconductor substrate and the second semiconductor substrate.

In Example 14, the subject matter of Example 13 can optionally include placing solder or adhesive glue or a sinter material on the first metal layer structure and/or the electrical interconnect and/or the second metal layer structure for connecting the first semiconductor substrate and the second semiconductor substrate.

In Example 15, the subject matter of Example 13 or 14 can optionally include wherein the spacer comprises a number of spacer members and a spacer frame to which the spacer members are attached, the method further comprising removing at least parts of the spacer frame from the spacer members to separate the spacer members from each other.

According to another aspect of the disclosure, the spacer is a PCB spacer 560 which, however, does not have an electrical interconnect or is not used as an electrical interconnect between the first semiconductor substrate 120 and the second semiconductor substrate 140. Such PCB spacer nevertheless provide for improved chip stacking properties in terms of device stability and scalability.

Such PCB spacer may be formed and used the same way as disclosed above. Devices assembled by using such spacers can be the same devices as devices 100, 200, 1100 except that no intra-spacer electrical routing facility is available. Hence, external terminals may be provide on the first and second semiconductor substrates 120, 140 or electrical connections between the first and second semiconductor substrates 120, 140 may be implemented by other means, e.g. by wire bonding. Apart from this, devices according to this further aspect of the disclosure may be designed in accordance with the devices 100, 200, 1100, and reference is made to the above description in order to avoid reiteration.

The following examples pertain to this further aspect of the disclosure:

Example 16 is a device for controlling trapped ions. The device includes a first semiconductor substrate. A second semiconductor substrate is disposed over the first semiconductor substrate. One or a plurality of ion traps is configured to trap ions in a space between the first semiconductor substrate and the second semiconductor substrate. A printed circuit board spacer is disposed between the first semiconductor substrate and the second semiconductor substrate.

In Example 17, the subject matter of Example 16 can optionally include wherein
the first semiconductor substrate is provided with a first metal layer structure implemented at a top side of the first semiconductor substrate; the second semiconductor substrate is provided with a second metal layer structure implemented at a bottom side of the second semiconductor substrate; and the printed circuit board spacer comprises vias configured to electrically connect the first metal layer structure with the second metal layer structure.

In Example 18, the subject matter of Example 16 or 17 can optionally include wherein the printed circuit board spacer has a thickness in a range between 100 µm and 400 µm or 200 µm and 300 µm.

In Example 19, the subject matter of any of Examples 16 to 18 can optionally include wherein the printed circuit board spacer comprises a top metallization layer, an intermediate metallization layer and a bottom metallization layer, wherein the intermediate metallization layer is designed as an electrical redistribution layer to electrically connect between electrodes structured in the top metallization layer and electrodes structured in the bottom metallization layer.

In Example 20, the subject matter of any of Examples 16 to 19 can optionally include wherein the printed circuit board spacer has metallized side walls facing the space between the first semiconductor substrate and the second semiconductor substrate.

In Example 21, the subject matter of any of Examples 16 to 20 can optionally include wherein the printed circuit board spacer comprises optical ports configured to introduce laser light into the space between the first semiconductor substrate and the second semiconductor substrate.

In Example 22, the subject matter of any of Examples 16 to 21 can optionally include wherein the printed circuit board spacer comprises a number of individual printed circuit board spacer members, the individual printed circuit board spacer members are disposed at corners of the first semiconductor substrate and the second semiconductor substrate.

In Example 23, the subject matter of any of Examples 16 to 22 can optionally include wherein the first semiconductor substrate is provided with some or all external terminals of the device, wherein some of the external terminals are electrically connected to the second metal layer structure of the second semiconductor substrate.

In Example 24, the subject matter of any of Examples 16 to 23 can optionally include wherein the first semiconductor substrate and/or the second semiconductor substrate are provided with an opening for optical access to the space between the first semiconductor substrate and the second semiconductor substrate.

Example 25 is a method of manufacturing a device for controlling trapped ions. The method comprises providing a first semiconductor substrate. The method further comprises placing a printed circuit board spacer over the first semiconductor substrate and placing a second semiconductor substrate over the printed circuit board spacer. The first semiconductor substrate is connected with the printed circuit board spacer. The second semiconductor substrate is connected with the printed circuit board spacer. Frame parts of the printed circuit board spacer are removed, wherein one or a plurality of ion traps configured to trap ions is provided in a space between the first semiconductor substrate and the second semiconductor substrate.

In Example 26, the subject matter of Example 25 can optionally include placing solder or adhesive glue or a sinter material on the first semiconductor substrate to connect the first semiconductor substrate with the printed circuit board spacer.

In Example 27, the subject matter of Example 25 or 26 can optionally include placing solder or adhesive glue or a sinter material on the printed circuit board spacer to connect the second semiconductor substrate with the printed circuit board spacer.

In Example 28, the subject matter of any of Examples 25 to 27 can optionally include bending the frame parts of the printed circuit board spacer for removing them from the printed circuit board spacer members connected to the first semiconductor substrate and to the second semiconductor substrate.

According to still another aspect of the disclosure, the spacer is a metal spacer 1360 which, however, is not used as an electrical interconnect between the first semiconductor substrate 120 and the second semiconductor substrate 140. Such metal spacer nevertheless provide for improved chip stacking properties in terms of device stability and scalability.

Such metal spacers may be formed and used the same way as disclosed above, except that no intra-spacer electrical routing facility is used. Hence, external terminals may be provide on the first and second semiconductor substrates 120, 140 or electrical connections between the first and second semiconductor substrates 120, 140 may be implemented by other means, e.g. by wire bonding. Apart from this, devices according to this further aspect of the disclosure may be designed in accordance with the devices 100, 200, 1100, and reference is made to the above description in order to avoid reiteration.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for trapping ions, the device comprising:
   a substrate comprising a metal layer structure; and
   at least one ion trap configured to trap ions in a space over the substrate;
   wherein the metal layer structure is a multi-layer metal structure that comprises:
   a top metal layer comprising one or more electrodes forming part of the at least one ion trap;
   a redistribution metal layer comprising wiring for connecting the one or more electrodes;
   a first insulating layer arranged between the top metal layer and the redistribution layer and comprising one or more voids; and
   one or more connection elements arranged in the one or more voids that connect the wiring from the redistribution metal layer with the one or more electrodes in the top metal layer.

2. The device of claim 1, wherein the wiring comprises a first wire for connecting a first electrode of the one or more electrodes with a first external terminal, and wherein the wiring further comprises a second wire for connecting a second electrode of the one or more electrodes with a second external terminal.

3. The device of claim 2, wherein the first external terminal and the second external terminal are formed in the top metal layer.

4. The device of claim 3, further comprising:
   an application board comprising a plurality of lead terminals,
   wherein the substrate is mounted on the application board, and
   wherein the first external terminal is connected with a first lead terminal of the plurality of lead terminals and the second external terminal is connected with a second lead terminal of the plurality of lead terminals.

5. The device of claim 4, wherein the first external terminal is connected with the first lead terminal of the application board via wire bonding, and wherein the second external terminal is connected with the second lead terminal of the application board via wire bonding.

6. The device of claim 4, wherein the substrate is mounted on the application via a glue.

7. The device of claim 1, wherein the multi-layer metal structure further comprises:
   a continuous metal layer arranged between the substrate and the redistribution metal layer; and
   a second insulating layer arranged between the redistribution metal layer and the continuous metal layer.

8. The device of claim 1, wherein the substrate comprises one or more metallized areas covering a surface of the substrate in regions where laser light is introduced into the device.

9. The device of claim 1, wherein the top metal layer further comprises one or more metallized areas that do not form part of the at least one ion trap that cover a surface of the substrate laterally adjacent to the at least one ion trap.

10. The device of claim 1, wherein the one or more electrodes comprise at least one RF electrode and at least one DC electrode.

11. The device of claim 1, wherein the multi-layer metal stack is formed of a material that comprises at least one of: Cu, Al, Au, Pt, Pd, Ti and TiW.

12. The device of claim 1, wherein an upper surface of the top metal layer comprises at least one of Au and Pt.

13. The device of claim 1, wherein the first insulating layer is formed of a material that comprises at least one of silicon oxide and silicon nitride.

14. A device for controlling trapped ions, the device comprising:
   a first substrate;
   a second substrate disposed over the first substrate;
   at least one ion trap configured to trap ions in a space between the first substrate and the second substrate; and
   a spacer disposed between the first substrate and the second substrate, the spacer comprising an electrical interconnect which electrically connects a first metal layer structure of the first substrate to a second metal layer structure of the second substrate.

15. The device of claim 14, wherein the spacer comprises a printed circuit board.

16. The device of claim 15, wherein the printed circuit board is provided with vias forming the electrical interconnect.

17. The device of claim 15, wherein the printed circuit board comprises a top metallization layer, an intermediate metallization layer and a bottom metallization layer, and wherein the intermediate metallization layer is structured as an electrical redistribution layer.

18. The device of claim 15, wherein the printed circuit board has metallized side walls facing the space between the first substrate and the second substrate.

19. The device of claim 14, wherein the first substrate is provided with external terminals of the device and the external terminals are electrically connected via the electrical interconnect to the second metal layer structure of the second substrate.

20. The device of claim 14, wherein the first substrate and/or the second substrate is provided with an opening for optical access to the space between the first substrate and the second substrate.

* * * * *